(12) United States Patent
Zhao et al.

(10) Patent No.: US 12,029,135 B2
(45) Date of Patent: Jul. 2, 2024

(54) MAGNETIC RANDOM-ACCESS MEMORY CELL, MEMORY AND DEVICE

(71) Applicant: BEIHANG UNIVERSITY, Beijing (CN)

(72) Inventors: Weisheng Zhao, Beijing (CN); Zhaohao Wang, Beijing (CN); Kaihua Cao, Beijing (CN); Gefei Wang, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 437 days.

(21) Appl. No.: 17/555,441

(22) Filed: Dec. 18, 2021

(65) Prior Publication Data
US 2022/0254993 A1    Aug. 11, 2022

(30) Foreign Application Priority Data
Feb. 10, 2021  (CN) .................. 202110183850.X

(51) Int. Cl.
*H10N 50/10* (2023.01)
*H10B 61/00* (2023.01)
*H10N 50/80* (2023.01)

(52) U.S. Cl.
CPC ............. *H10N 50/10* (2023.02); *H10B 61/00* (2023.02); *H10N 50/80* (2023.02)

(58) Field of Classification Search
CPC ......... H10N 50/10; H10N 50/80; H10B 61/00
(Continued)

(56) References Cited

U.S. PATENT DOCUMENTS

| 2016/0232958 A1 | 8/2016 | Bandiera |
| 2018/0114557 A1 | 4/2018 | Park et al. |

(Continued)

FOREIGN PATENT DOCUMENTS

| CN | 109166962 A | 1/2019 |
| CN | 110197682 A | 9/2019 |
| CN | 110660420 A | 1/2020 |

OTHER PUBLICATIONS

Fukami et al., A spin-orbit torque switching scheme with collinear magnetic easy axis and current configuration, Nature Nanotechnology, vol. 11, pp. 621-626, dated Mar. 21, 2016.
(Continued)

*Primary Examiner* — Jami Valentine Miller
(74) *Attorney, Agent, or Firm* — Westbridge IP LLC

(57) ABSTRACT

The present disclosure provides a magnetic random-access memory cell, a memory and a device. The magnetic random-access memory cell comprises: a spin-orbit coupling layer and a first magnetic tunnel junction and a second magnetic tunnel junction disposed on the spin-orbit coupling layer, the first magnetic tunnel junction and the second magnetic tunnel junction having at least two symmetrical axes with different lengths; an angle between an easy magnetization symmetrical axis direction of a free layer of the first magnetic tunnel junction and a length direction of the spin-orbit coupling layer is a preset first angle, and an angle between an easy magnetization symmetrical axis direction of a free layer of the second magnetic tunnel junction and the length direction of the spin-orbit coupling layer is a preset second angle; neither of the first angle and the second angle is zero degree, 90 degrees or 180 degrees.

11 Claims, 3 Drawing Sheets

(58) Field of Classification Search
USPC .......................................................... 257/421
See application file for complete search history.

(56) References Cited

U.S. PATENT DOCUMENTS

| 2019/0051339 | A1* | 2/2019 | Zhao | ...................... G11C 11/161 |
| 2020/0402558 | A1* | 12/2020 | Phung | ................. H01F 10/3254 |
| 2022/0285610 | A1* | 9/2022 | Zhao | ...................... H10N 52/80 |

OTHER PUBLICATIONS

Honjo et al., First demonstration of field-free SOT-MRAM with 0.35 ns write speed and 70 thermal stability under 400° C. thermal tolerance by canted SOT structure and its advanced patterning/SOT channel technology, 2019 IEEE International Electron Devices Meeting (IEDM), San Francisco, CA, USA, dated Dec. 7, 2019.
First Office Action issued in counterpart Chinese Patent Application No. 202110183850.X, dated May 7, 2022.

* cited by examiner

MAGNETIC RANDOM-ACCESS MEMORY CELL, MEMORY AND DEVICE

CROSS-REFERENCE TO RELATED APPLICATIONS

This application claims priority to Chinese Application Number 202110183850.X, filed on Feb. 10, 2021, the subject matter of which is incorporated herein by reference.

TECHNICAL FIELD

The present disclosure relates to a technical field of semiconductor devices, and in particular to a magnetic random-access memory cell, a memory and a device.

BACKGROUND ART

With the continuous reduction of the semiconductor process size, the Moore's Law slows down, and the increase of leakage current and the interconnection delay become the bottlenecks of the traditional CMOS memory. The Magnetic Random-Access Memory (MRAM) is expected to be a universal memory due to the advantages of an unlimited number of times of erasing, a non-volatility, fast read and write speeds, a radiation resistance, etc., and it is an ideal device for constructing a next generation of non-volatile primary memory and buffer memory. The Magnetic Tunnel Junction (MTJ) is a basic memory cell of the magnetic random-access memory. The second-generation Spin-Transfer Torque MRAM (STT-MRAM) has the disadvantages such as a long incubation delay, read and write interferences, etc., which limit further development thereof. The Spin-Orbit Torque MRAM (SOT-MRAM) has attracted wide attentions from the industrial and academic worlds due to its advantages of a fast write speed, a separation of read and write paths and a low power consumption.

At present, logics or data of the SOT-MRAM based on the spin-orbit torque often require magnetic tunnel junctions that can store two opposite resistance states, such as a high-resistance state and a low-resistance state, and then require magnetic random-access memory cells that can determine the magnetic tunnel junctions that provide two different resistance states. For example, a certain type of magnetic random-access memory cell uses a pair of magnetic tunnel junctions with opposite resistance states to store one bit of data, in order for differential reading. However, at present, a storage of opposite resistance states in a magnetic random-access memory usually needs to be realized through multiple writes, or a non-standard manufacturing process should be adopted, and the realization mode is complicated.

SUMMARY OF THE DISCLOSURE

An objective of the present disclosure is to provide a magnetic random-access memory cell to reduce the complexity of realizing magnetic tunnel junctions with opposite resistance states. Another objective of the present disclosure is to provide a magnetic random-access memory. Still another objective of the present disclosure is to provide a computer device.

In order to achieve the above objectives, in an aspect, the present disclosure discloses a magnetic random-access memory cell, comprising: a spin-orbit coupling layer and a first magnetic tunnel junction and a second magnetic tunnel junction disposed on the spin-orbit coupling layer, the first magnetic tunnel junction and the second magnetic tunnel junction having at least two symmetrical axes with different lengths; an angle between an easy magnetization symmetrical axis direction of a free layer of the first magnetic tunnel junction and a length direction of the spin-orbit coupling layer is a preset first angle, and an angle between an easy magnetization symmetrical axis direction of a free layer of the second magnetic tunnel junction and the length direction of the spin-orbit coupling layer is a preset second angle; neither of the first angle and the second angle is zero degree, 90 degrees or 180 degrees;

when spin-orbit torque current is input to the spin-orbit coupling layer, a magnetic torque direction of the free layer of each of the first magnetic tunnel junction and the second magnetic tunnel junction changes to the easy magnetization symmetrical axis direction, so that resistance states of the first magnetic tunnel junction and the second magnetic tunnel junction are opposite to each other.

Preferably, the first magnetic tunnel junction and the second magnetic tunnel junction are shaped as elliptical, the easy magnetization symmetrical axis is a long axis of an elliptical magnetic tunnel junction, an angle between a long axis direction of the free layer of the first magnetic tunnel junction and the length direction of the spin-orbit coupling layer is a preset first angle, and an angle between a long axis direction of the free layer of the second magnetic tunnel junction and the length direction of the spin-orbit coupling layer is a preset second angle.

Preferably, the spin-orbit coupling layer comprises a length direction and a width direction; the length direction comprises two input directions of the spin-orbit torque current, i.e., a first direction and a second direction which are opposite to each other, and the width direction comprises two input directions of the spin-orbit torque current, i.e., a third direction and a fourth direction which are opposite to each other.

Preferably, an angle between the first direction and the easy magnetization symmetrical axis direction of the free layer of the first magnetic tunnel junction is a preset first angle, an angle between the first direction and the easy magnetization symmetrical axis direction of the free layer of the second magnetic tunnel junction is a preset second angle which is complementary to the first angle, and an angle formed by the magnetic torque direction of the fixed layer of the first magnetic tunnel junction and the first direction is equal to an angle formed by the magnetic torque direction of the fixed layer of the second magnetic tunnel junction and the first direction;

when the spin-orbit torque current is input to the spin-orbit coupling layer along the first direction or the second direction, the resistance states of the first magnetic tunnel junction and the second magnetic tunnel junction are opposite to each other.

Preferably, an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is equal to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the first direction or the second direction, the resistance states of the first magnetic tunnel junction and the second magnetic tunnel junction are opposite to each other.

Preferably, an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is complementary to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the third direction or the fourth direction, the resistance states of the first magnetic tunnel junction and the second magnetic tunnel junction are opposite to each other.

Preferably, an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is equal to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the third direction or the fourth direction, the resistance states of the first magnetic tunnel junction and the second magnetic tunnel junction are opposite to each other.

Preferably, further comprising a write module configured to input the spin-orbit torque current to the spin-orbit coupling layer, so as to change the magnetic torque direction of the free layer of each of the first magnetic tunnel junction and the second magnetic tunnel junction to the easy magnetization symmetrical axis direction, so that the resistance states of the first magnetic tunnel junction and the second magnetic tunnel junction are opposite to each other.

Preferably, further comprising a read unit configured to input detection current to the first magnetic tunnel junction and the second magnetic tunnel junction, and determine the resistance states of the first magnetic tunnel junction and the second magnetic tunnel junction according to a change of the detection current input thereto.

The present disclosure further discloses a magnetic random-access memory, comprising a plurality of the magnetic random-access memory cells described above and arranged in an array.

The present disclosure further discloses computer device, comprising a memory, a processor, and a computer program stored on the memory and operable on the processor, the processor and/or the memory comprises the magnetic random-access memory unit described above.

The magnetic random-access memory cell of the present disclosure adopts the elliptical first magnetic tunnel junction and second magnetic tunnel junction, inputs the spin-orbit torque current to the spin-orbit coupling layer, and changes the magnetic torque direction of the free layer of the elliptical magnetic tunnel junction of in-plane magnetic anisotropy through the spin-orbit torque current, so that that the first magnetic tunnel junction and the second magnetic tunnel junction respectively store the opposite resistance states, i.e., a pair of complementary logical numbers. According to the present disclosure, the magnetic tunnel junction of in-plane magnetic anisotropy is adopted, and the resistance states of the two magnetic tunnel junctions are opposite to each other by inputting the spin-orbit torque current at a time, so that the complementary logic numbers are stored, and the data writing complexity is reduced. In addition, the magnetic random-access memory cell of the present disclosure has a simple process and it is unnecessary to consider the complex interface effect, thereby achieving a high reliability.

BRIEF DESCRIPTION OF THE DRAWINGS

In order to explain the technical solutions in the embodiments of the present disclosure or in the prior art more clearly, the drawings to be used in the description of the embodiments or the prior art will be briefly introduced below. Obviously, the drawings used in the following description only illustrate some embodiments of the present disclosure, and other drawings can be obtained from them by persons of ordinary skill in the art without paying a creative labor.

DETAILED DESCRIPTION OF THE PREFERRED EMBODIMENTS

The technical solutions in the embodiments of the present disclosure will be described clearly and completely with reference to the drawings in the embodiments of the present disclosure. Obviously, those described are merely part, rather than all, of the embodiments of the present disclosure. Based on the embodiments of the present disclosure, any other embodiment obtained by persons of ordinary skill in the art without paying a creative labor should fall within the protection scope of the present disclosure.

Figure 1:
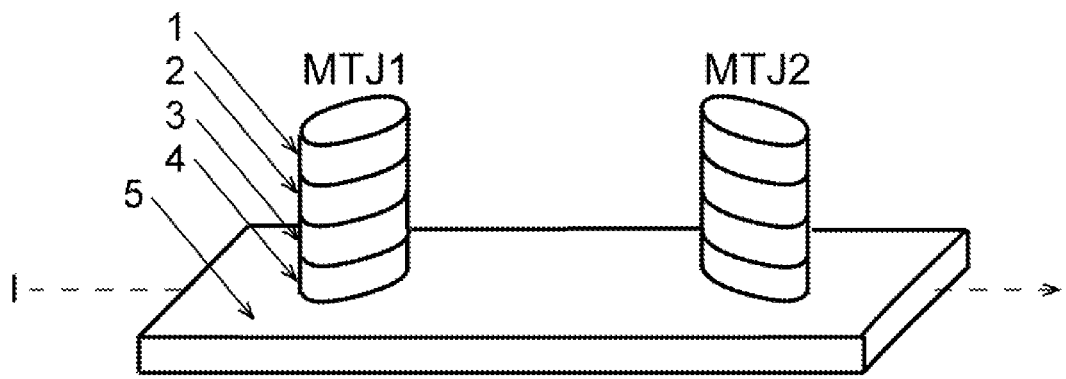
FIG. 1 illustrates a structural diagram of a magnetic random-access memory cell according to an embodiment of the present disclosure.

According to an aspect of the present disclosure, an embodiment discloses a magnetic random-access memory cell. As illustrated in FIG. 1, in this embodiment, the magnetic random-access memory cell comprises a spin-orbit coupling layer 5, and a first magnetic tunnel junction MTJ1 and a second magnetic tunnel junction MTJ2 which are disposed on the spin-orbit coupling layer 5 and shaped as elliptical.

In which, when spin-orbit torque current I is input to the spin-orbit coupling layer 5, a magnetic torque direction of each of free layers 4 of the first magnetic tunnel junction MTJ1 and the second magnetic tunnel junction MTJ2 changes to a direction of an elliptical long axis, so that resistance states of the first magnetic tunnel junction MTJ1 and the second magnetic tunnel junction MTJ2 are opposite to each other. If the spin-orbit torque current I is applied in an opposite direction, the resistance states of the first magnetic tunnel junction MTJ1 and the second magnetic tunnel junction MTTJ2 are both reversed but still opposite to each other. In a specific example, a pair of opposite resistance states of the first magnetic tunnel junction MTJ1 and the second magnetic tunnel junction MTJ2 may be used to store one bit of data, for differential reading. For example, when the resistance states of the first magnetic tunnel junction MTJ1 and the second magnetic tunnel junction MTJ2 are a low-resistance state and a high-resistance state respectively, the one bit of data correspondingly stored in the cell is '0'; and when the resistance states of the first magnetic tunnel junction MTJ1 and the second magnetic tunnel junction MTJ2 are a high-resistance state and a low-resistance states respectively, the one bit of data correspondingly stored in the cell is '1'.

It should be noted that the elliptical long axis of the elliptical magnetic tunnel junction is an easy magnetization direction of the free layer, that is, when the spin-orbit torque current I is input to the spin-orbit coupling layer 5, the magnetic torque direction of the free layer turns to the direction of the elliptical long axis. In which, based on the different directions of the input spin-orbit torque current I, the magnetic torque direction of the free layer deflects towards the two opposite directions of the elliptical long axis.

The magnetic random-access memory cell of the present disclosure adopts the elliptical first magnetic tunnel junction MTJ1 and second magnetic tunnel junction MTJ2, inputs the spin-orbit torque current I to the spin-orbit coupling layer 5, and changes the magnetic torque direction of the free layer 4 of the elliptical magnetic tunnel junction of in-plane magnetic anisotropy through the spin-orbit torque current I, so that that the first magnetic tunnel junction MTJ1 and the second magnetic tunnel junction MTJ2 respectively store the opposite resistance states, i.e., a pair of complementary logical numbers. According to the present disclosure, the magnetic tunnel junction of in-plane magnetic anisotropy is adopted, and the resistance states of the two magnetic tunnel junctions are opposite to each other by inputting the spin-orbit torque current I at a time, so that the complementary logic numbers are stored, and the data writing complexity is reduced. In addition, the magnetic random-access memory cell of the present disclosure has a simple process and it is unnecessary to consider the interface effect, thereby achieving a high reliability.

In a preferred embodiment, the spin-orbit coupling layer 5 comprises a length direction and a width direction, wherein the length direction comprises two input directions of the spin-orbit torque current I, i.e., a first direction and a second direction which are opposite to each other, and the width direction comprises two input directions of the spin-orbit torque current I, i.e., a third direction and a fourth direction which are opposite to each other.

It should be noted that as illustrated in FIGS. 2 to 5, the spin-orbit coupling layer 5 comprises a length direction X and a width direction Y, wherein the length direction X comprises a first direction A and a second direction B, and the width direction y comprises a third direction C and a fourth direction D. In an optional embodiment, at least one of the first magnetic tunnel junction MTJ1 and the second magnetic tunnel junction MTJ2 may comprise a fixed layer 2, a barrier layer 3, and a free layer 4 sequentially disposed from top to bottom. A bottom surface of the free layer 4 is fixedly connected with the spin-orbit coupling layer 5. It can be understood that the resistance of the magnetic tunnel junction depends on the magnetization directions of the fixed layer 2 and the free layer 4, while those magnetization directions are determined by the magnetic torque directions. In which, the magnetic tunnel junction is in a low-resistance state when the magnetic torque directions of the fixed layer 2 and the free layer 4 are the same, and is in a high-resistance state when the magnetic torque directions of the fixed layer 2 and the free layer 4 are opposite to each other. A current or voltage is input to the magnetic tunnel junction through a read circuit. According to a change of the current or the voltage, it can be determined whether the resistance state of the magnetic tunnel junction is a high-resistance state or a low-resistance state, and according to the resistance states of the two magnetic tunnel junctions, it can be determined whether the data stored in the cell is '1' or '0'. In which, the determination of the ranges of the high-resistance state and the low-resistance state are conventional technical means in the art, and those skilled in the art can determine the ranges of the resistance values of the high-resistance state and the low-resistance state of the magnetic tunnel junction according to the common knowledge, which will not be described here.

It can be understood that the directions of the elliptical long axes of the first magnetic tunnel junction MTJ1 and the second magnetic tunnel junction MTJ2 and the direction of the fixed layer 2 may be set, and the input direction of the spin-orbit torque current I may be set, so that when the spin-orbit torque current I is input to the spin-orbit coupling layer 5 along one of the first direction A, the second direction B, the third direction C and the fourth direction D of the spin-orbit coupling layer 5, the free layer 4 of one of the first magnetic tunnel junction MTJ1 and second magnetic tunnel junction MTJ2 has a magnetic torque direction the same as that of the fixed layer 2, while the free layer 4 of the other of the magnetic tunnel junctions has a magnetic torque direction opposite to that of the fixed layer 2, and then the resistance states of the first magnetic tunnel junction MTJ1 and the second magnetic tunnel junction MTJ2 are opposite to each other. Different resistance states of the magnetic tunnel junctions are preset to be corresponding to different logic numbers, then the logical numbers stored in the memory cell can be determined by reading and determining the resistance states of the first magnetic tunnel junction MTJ1 and the second magnetic tunnel junction MTJ2. According to the actual situations, those skilled in the art can set the magnetic torque direction of the fixed layer 2 and the direction of the elliptical long axis of the free layer 4 in each of the first magnetic tunnel junction MTJ1 and the second magnetic tunnel junction MTJ2 in addition to the input direction of the spin-orbit torque current I, so that when the spin-orbit torque current I is input to the spin-orbit coupling layer 5, the resistance states of the first magnetic tunnel junction MTJ1 and the second magnetic tunnel junction MTJ2 are a high-resistance state and a low-resistance states respectively, which are not limited by the present disclosure.

In a preferred embodiment, as illustrated in FIG. 1, at least one of the first magnetic tunnel junction MTJ1 and the second magnetic tunnel junction MTJ2 may further comprise an auxiliary layer 1 which is disposed on the fixed layer 2 and may be configured to stabilize the magnetic torque direction of the fixed layer 2 and improve the reliability of the magnetic random-access memory cell.

Figure 2:
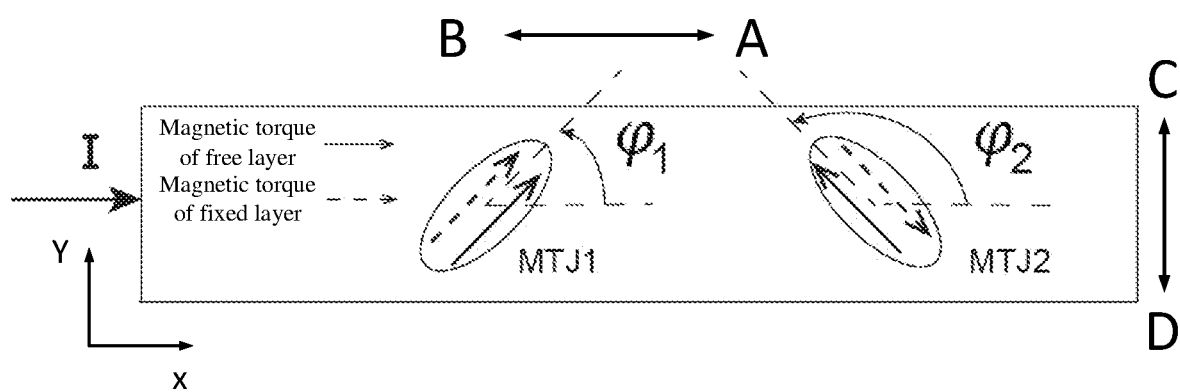
FIGS. 2 to 5 illustrate structural top views of specific examples of a magnetic random-access memory cell of the present disclosure.

In an optional embodiment, as illustrated in FIG. 2, an angle between the direction of the elliptical long axis of the free layer 4 of the first magnetic tunnel junction MTJ1 and the first direction A is a preset first angle $\varphi 1$, and an angle between the direction of the elliptical long axis of the free layer 4 of the second magnetic tunnel junction MTJ2 and the first direction A is a preset second angle $\varphi 2$, wherein the angles φ1 and φ2 are complementary to each other. An angle formed by the magnetic toque direction of the fixed layer 2 of the first magnetic tunnel junction MTJ1 and the first direction A is equal to an angle formed by the magnetic torque direction of the fixed layer 2 of the second magnetic tunnel junction MTJ2 and the first direction A. The resistance states of the first magnetic tunnel junction MTJ1 and the second magnetic tunnel junction MTJ2 are opposite to each other when the spin-orbit torque current I is input to the spin-orbit coupling layer 5 along the first direction A or the second direction B.

It should be noted that in this embodiment, the first angle φ1 is a counterclockwise angle between the first magnetic tunnel junction MTJ1 and the first direction A, and the second angle φ2 is a counterclockwise angle between the second magnetic tunnel junction MTJ2 and the first direction A. In other embodiments, the first angle φ1 may be a clockwise angle between the first magnetic tunnel junction MTJ1 and any other direction, and the second angle φ2 may be a clockwise angle between the second magnetic tunnel junction MTJ2 and any other direction. The first angle φ1 and the second angle φ2 may be measured based on the same direction, which is not limited by the present disclosure.

It can be understood that in this optional embodiment, the first angle φ1 is formed between the direction of the elliptical long axis of the first magnetic tunnel junction MTJ1 and the first direction A of the spin-orbit coupling layer 5, and the second angle φ2 is formed between the direction of the elliptical long axis of the second magnetic tunnel junction MTJ2 and the first direction A of the spin-orbit coupling layer 5, wherein the angles φ1 and φ2 are complementary to each other. Thus, when the spin-orbit torque current I is input to the spin-orbit coupling layer 5 along the first direction A or the second direction B, the angle formed by the magnetic torque direction of the free layer 4 of the first magnetic tunnel junction MTJ1 and the first direction A is complementary to the angle formed by the magnetic torque direction of the free layer 4 of the second magnetic tunnel junction MTJ2 and the first direction A. Then, it may be set that the angle formed by the magnetic torque direction of the fixed layer 2 of the first magnetic tunnel junction MTJ1 and the first direction A is equal to the angle formed by the magnetic torque direction of the fixed layer 2 of the second magnetic tunnel junction MTJ2 and the first direction A, so that after the spin-orbit torque current I is input, the magnetic torque directions of the free layer 4 and the fixed layer 2 of one of the first magnetic tunnel junction MTJ1 and the second magnetic tunnel junction MTJ2 are the same, and the magnetic torque directions of the free layer 4 and the fixed layer 2 of the other of the magnetic tunnel junctions are opposite to each other. Thus, the resistance states of the first magnetic tunnel junction MTJ1 and the second magnetic tunnel junction MTJ2 are opposite to each other, and opposite resistance states of different magnetic tunnel junctions can be written by a current input operation at a time. For example, in the magnetic random-access memory cell illustrated in FIG. 1, when the spin-orbit torque current I is input to the spin-orbit coupling layer 5 along the first direction A, under the action of the spin-orbit torque current I, finally the angle between the magnetic torque direction of the free layer of the first magnetic tunnel junction MTJ1 and the first direction A is φ1, and the angle between the magnetic torque direction of the free layer of the second magnetic tunnel junction MTJ2 and the first direction A is φ2, wherein the angles φ1 and φ2 are complementary to each other. It is preset that the angle between the magnetic torque direction of the fixed layer of the first magnetic tunnel junction MTJ1 and the first direction A is φ1, the magnetic torque directions of the free layer and the fixed layer of the first magnetic tunnel junction MTJ1 are the same, and the resistance state of the first magnetic tunnel junction MTJ1 is a low-resistance state. It is preset that the angle between the opposite direction of the magnetic torque direction of the fixed layer of the second magnetic tunnel junction MTJ2 and the first direction A is φ2, the magnetic torque directions of the free layer and the fixed layer of the second magnetic tunnel junction MTJ2 are opposite to each other, and the resistance state of the first magnetic tunnel junction MTJ2 is a high-resistance state. Similarly, when the spin-orbit torque current I is input to the spin-orbit coupling layer 5 along the second direction B, finally the resistance state of the first magnetic tunnel junction MTJ1 is a high-resistance state, and the resistance state of the second magnetic tunnel junction MTJ2 is a low-resistance state. When the spin-orbit torque current I is input along either the first direction A or the second direction B, two magnetic tunnel junctions with opposite resistance states can be obtained, that is, the cell stores logic numbers '0' and '1' in the two cases respectively.

Figure 3:
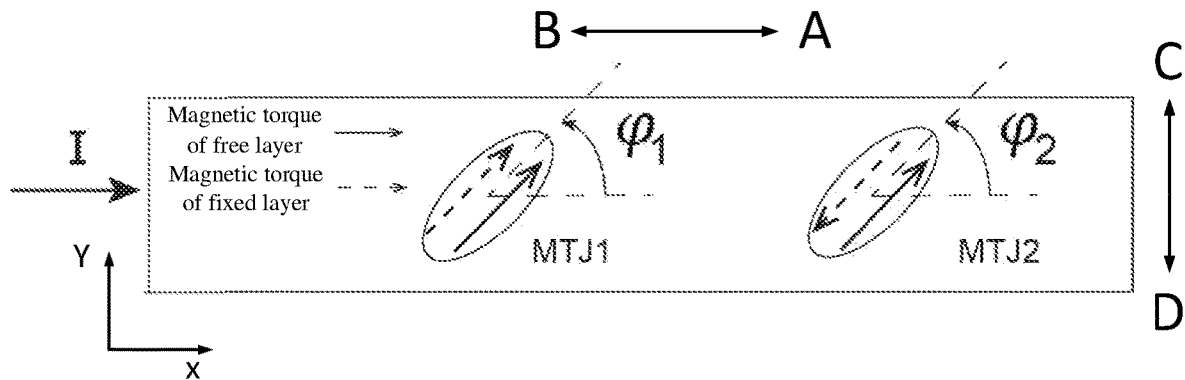

In another optional embodiment, as illustrated in FIG. 3, an angle between the direction of the elliptical long axis of the free layer 4 of the first magnetic tunnel junction MTJ1 and the first direction A is a preset first angle φ1, and an angle between the direction of the elliptical long axis of the free layer 4 of the second magnetic tunnel junction MTJ2 and the first direction A is a preset second angle φ2, wherein the angles φ1 and φ2 are equal to each other. The angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A. When the spin-orbit torque current I is input to the spin-orbit coupling layer 5 along the first direction A or the second direction B, the resistance states of the first magnetic tunnel junction MTJ1 and the second magnetic tunnel junction MTJ2 are opposite to each other.

It can be understood that in this optional embodiment, the first angle φ1 is formed between the direction of the elliptical long axis of the first magnetic tunnel junction MTJ1 and the first direction A of the spin-orbit coupling layer 5, and the second angle φ2 is formed between the direction of the elliptical long axis of the second magnetic tunnel junction MTJ2 and the first direction A of the spin-orbit coupling layer 5, wherein the angles φ1 and φ2 are equal to each other. Thus, when the spin-orbit torque current I is input to the spin-orbit coupling layer 5 along the first direction A or the second direction B, the angle formed by the magnetic torque direction of the free layer 4 of the first magnetic tunnel junction MTJ1 and the first direction A is equal to the angle formed by the magnetic torque direction of the free layer 4 of the second magnetic tunnel junction MTJ2 and the first direction A. Then, it may be set that the angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A, so that after the spin-orbit torque current I is input, the magnetic torque directions of the free layer 4 and the fixed layer 2 of one of the first magnetic tunnel junction MTJ1 and the second magnetic tunnel junction MTJ2 are the same, and the magnetic torque directions of the free layer 4 and the fixed layer 2 of the other of the magnetic tunnel junctions are opposite to each other. Thus, the resistance states of the first magnetic tunnel junction MTJ1 and the second magnetic tunnel junction MTJ2 are opposite to each other, and opposite resistance states of different magnetic tunnel junctions can be written by a current input operation at a time. For example, in the magnetic random-access memory cell illustrated in FIG. 2, when the spin-orbit torque current I is input to the spin-orbit coupling layer 5 along the first direction A, under the action of the spin-orbit torque current I, finally the angle between the magnetic torque direction of the free layer of the first magnetic tunnel junction MTJ1 and the first direction A is $\varphi 1$, and the angle between the magnetic torque direction of the free layer of the second magnetic tunnel junction MTJ2 and the first direction A is $\varphi 2$, wherein the angles $\varphi 1$ and $\varphi 2$ are equal to each other. It is preset that the angle between the magnetic torque direction of the fixed layer of the first magnetic tunnel junction MTJ1 and the first direction A is $\varphi 1$, the magnetic torque directions of the free layer and the fixed layer of the first magnetic tunnel junction MTJ1 are the same, and the resistance state of the first magnetic tunnel junction MTJ1 is a low-resistance state. It is preset that the angle between the opposite direction of the magnetic torque direction of the fixed layer of the second magnetic tunnel junction MTJ2 and the first direction A is $\varphi 2$, the magnetic torque directions of the free layer and the fixed layer of the second magnetic tunnel junction MTJ2 are opposite to each other, and the resistance state of the first magnetic tunnel junction MTJ2 is a high-resistance state. Similarly, when the spin-orbit torque current I is input to the spin-orbit coupling layer 5 along the second direction B, finally the resistance state of the first magnetic tunnel junction MTJ1 is a high-resistance state, and the resistance state of the second magnetic tunnel junction MTJ2 is a low-resistance state. When the spin-orbit torque current I is input along either the first direction A or the second direction B, two magnetic tunnel junctions with opposite resistance states can be obtained, that is, the cell stores logic numbers '0' and '1' in the two cases respectively.

Figure 4:
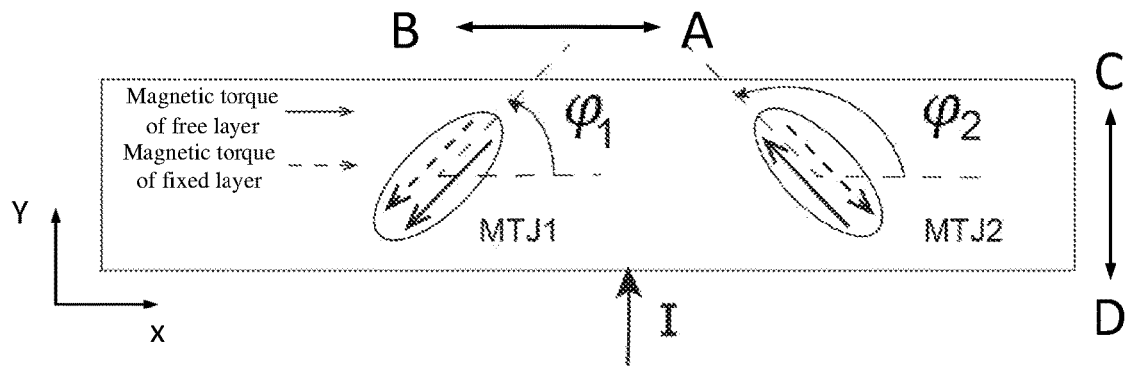

In another optional embodiment, as illustrated in FIG. 4, an angle between the direction of the elliptical long axis of the free layer 4 of the first magnetic tunnel junction MTJ1 and the first direction A is a preset first angle $\varphi 1$, and an angle between the direction of the elliptical long axis of the free layer 4 of the second magnetic tunnel junction MTJ2 and the first direction A is a preset second angle $\varphi 2$, wherein the angles $\varphi 1$ and $\varphi 2$ are complementary to each other. The angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A. When the spin-orbit torque current I is input to the spin-orbit coupling layer 5 along the third direction C or the fourth direction D, the resistance states of the first magnetic tunnel junction MTJ1 and the second magnetic tunnel junction MTJ2 are opposite to each other.

It can be understood that in this optional embodiment, the first angle $\varphi 1$ is formed between the direction of the elliptical long axis of the first magnetic tunnel junction MTJ1 and the first direction A of the spin-orbit coupling layer 5, and the second angle $\varphi 2$ is formed between the direction of the elliptical long axis of the second magnetic tunnel junction MTJ2 and the first direction A of the spin-orbit coupling layer 5, wherein the angles $\varphi 1$ and $\varphi 2$ are complementary to each other. Thus, when the spin-orbit torque current I is input to the spin-orbit coupling layer 5 along the third direction C or the fourth direction D, the angle formed by the magnetic torque direction of the free layer 4 of the first magnetic tunnel junction MTJ1 and the first direction A is equal to the angle formed by the magnetic torque direction of the free layer 4 of the second magnetic tunnel junction MTJ2 and the first direction A. Then, it may be set that the angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A, so that after the spin-orbit torque current I is input, the magnetic torque directions of the free layer 4 and the fixed layer 2 of one of the first magnetic tunnel junction MTJ1 and the second magnetic tunnel junction MTJ2 are the same, and the magnetic torque directions of the free layer 4 and the fixed layer 2 of the other of the magnetic tunnel junctions are opposite to each other. Thus, the resistance states of the first magnetic tunnel junction MTJ1 and the second magnetic tunnel junction MTJ2 are opposite to each other, and opposite resistance states of different magnetic tunnel junctions can be written by a current input operation at a time. For example, in the magnetic random-access memory cell illustrated in FIG. 4, when the spin-orbit torque current I is input to the spin-orbit coupling layer 5 along the third direction C, under the action of the spin-orbit torque current I, finally the angle between the opposite direction of the magnetic torque direction of the free layer of the first magnetic tunnel junction MTJ1 and the first direction A is $\varphi 1$, and the angle between the magnetic torque direction of the free layer of the second magnetic tunnel junction MTJ2 and the first direction A is $\varphi 2$, wherein the angles $\varphi 1$ and $\varphi 2$ are complementary to each other. It is preset that the angle between the opposite direction of the magnetic torque direction of the fixed layer of the first magnetic tunnel junction MTJ1 and the first direction A is $\varphi 1$, the magnetic torque directions of the free layer and the fixed layer of the first magnetic tunnel junction MTJ1 are the same, and the resistance state of the first magnetic tunnel junction MTJ1 is a low-resistance state. It is preset that the angle between the opposite direction of the magnetic torque direction of the fixed layer of the second magnetic tunnel junction MTJ2 and the first direction A is $\varphi 2$, the magnetic torque directions of the free layer and the fixed layer of the second magnetic tunnel junction MTJ2 are opposite to each other, and the resistance state of the first magnetic tunnel junction MTJ2 is a high-resistance state. Similarly, when the spin-orbit torque current I is input to the spin-orbit coupling layer 5 along the fourth direction D, finally the resistance state of the first magnetic tunnel junction MTJ1 is a high-resistance state, and the resistance state of the second magnetic tunnel junction MTJ2 is a low-resistance state. When the spin-orbit torque current I is input along either the third direction C or the fourth direction D, two magnetic tunnel junctions with opposite resistance states can be obtained, that is, the cell stores logic numbers '0' and '1' in the two cases respectively.

Figure 5:
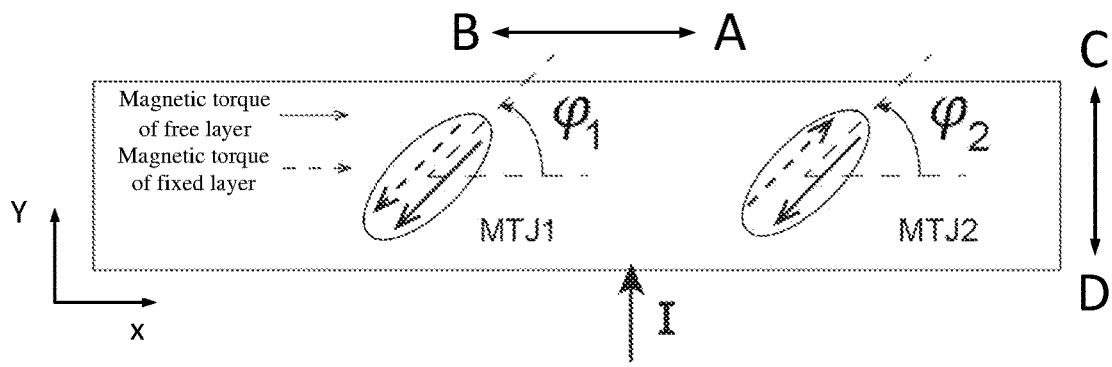

In another optional embodiment, as illustrated in FIG. 5, an angle between the direction of the elliptical long axis of the free layer 4 of the first magnetic tunnel junction MTJ1 and the first direction A is a preset first angle $\varphi 1$, and an angle between the direction of the elliptical long axis of the free layer 4 of the second magnetic tunnel junction MTJ2 and the first direction A is a preset second angle $\varphi 2$, wherein the angles $\varphi 1$ and $\varphi 2$ are equal to each other. The angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A. When the spin-orbit torque current I is input to the spin-orbit coupling layer 5 along the third direction C or the fourth direction D, the resistance states of the first magnetic tunnel junction MTJ1 and the second magnetic tunnel junction MTJ2 are opposite to each other.

It can be understood that in this optional embodiment, the first angle φ1 is formed between the direction of the elliptical long axis of the first magnetic tunnel junction MTJ1 and the first direction A of the spin-orbit coupling layer 5, and the second angle φ2 is formed between the direction of the elliptical long axis of the second magnetic tunnel junction MTJ2 and the first direction A of the spin-orbit coupling layer 5, wherein the angles φ1 and φ2 are equal to each other. Thus, when the spin-orbit torque current I is input to the spin-orbit coupling layer 5 along the third direction C or the fourth direction D, the angle formed by the magnetic torque direction of the free layer 4 of the first magnetic tunnel junction MTJ1 and the first direction A is equal to the angle formed by the magnetic torque direction of the free layer 4 of the second magnetic tunnel junction MTJ2 and the first direction A. Then, it may be set that the angle formed by the magnetic torque direction of the fixed layer 2 of the first magnetic tunnel junction MTJ1 and the first direction A is complementary to the angle formed by the magnetic torque direction of the fixed layer 2 of the second magnetic tunnel junction MTJ2 and the first direction A, so that after the spin-orbit torque current I is input, the magnetic torque directions of the free layer 4 and the fixed layer 2 of one of the first magnetic tunnel junction MTJ1 and the second magnetic tunnel junction MTJ2 are the same, and the magnetic torque directions of the free layer 4 and the fixed layer 2 of the other of the magnetic tunnel junctions are opposite to each other. Thus, the resistance states of the first magnetic tunnel junction MTJ1 and the second magnetic tunnel junction MTJ2 are opposite to each other, and opposite resistance states of different magnetic tunnel junctions can be written by a current input operation at a time. For example, in the magnetic random-access memory cell illustrated in FIG. 5, when the spin-orbit torque current I is input to the spin-orbit coupling layer 5 along the third direction C, under the action of the spin-orbit torque current I, finally the angle between the opposite direction of the magnetic torque direction of the free layer of the first magnetic tunnel junction MTJ1 and the first direction A is φ1, and the angle between the opposite direction of the magnetic torque direction of the free layer of the second magnetic tunnel junction MTJ2 and the first direction A is φ2, wherein the angles φ1 and φ2 are equal to each other. It is preset that the angle between the opposite direction of the magnetic torque direction of the fixed layer of the first magnetic tunnel junction MTJ1 and the first direction A is φ1, the magnetic torque directions of the free layer and the fixed layer of the first magnetic tunnel junction MTJ1 are the same, and the resistance state of the first magnetic tunnel junction MTJ1 is a low-resistance state. It is preset that the angle between the magnetic torque direction of the fixed layer of the second magnetic tunnel junction MTJ2 and the first direction A is φ2, the magnetic torque directions of the free layer and the fixed layer of the second magnetic tunnel junction MTJ2 are opposite to each other, and the resistance state of the first magnetic tunnel junction MTJ2 is a high-resistance state. Similarly, when the spin-orbit torque current I is input to the spin-orbit coupling layer 5 along the fourth direction D, finally the resistance state of the first magnetic tunnel junction MTJ1 is a high-resistance state, and the resistance state of the second magnetic tunnel junction MTJ2 is a low-resistance state. When the spin-orbit torque current I is input along either the third direction C or the fourth direction D, two magnetic tunnel junctions with opposite resistance states can be obtained, that is, the cell stores logic numbers '0' and '1' in the two cases respectively.

Preferably, the spin-orbit coupling layer 5 may be rectangular, so that a top surface area of the spin-orbit coupling layer 5 is larger than areas occupied by two magnetic tunnel junctions disposed on the spin-orbit coupling layer 5, i.e., two magnetic tunnel junctions may be disposed on the spin-orbit coupling layer 5, and outer edges of the two magnetic tunnel junctions are located at inner sides of the outer edges of the spin-orbit coupling layer 5. In which, the spin-orbit coupling layer 5 preferably may be a heavy metal strip film, an antiferromagnetic strip film or a topological insulator strip film.

It should be noted that there may be two or more magnetic tunnel junctions on the spin-orbit coupling layer 5. Preferably, a plurality of magnetic tunnel junctions may be disposed on the same spin-orbit coupling layer 5, which can realize one-time data writing operation for a plurality of magnetic tunnel junctions, reduce the number of controlled transistors to which the spin-orbit torque current I is input, then improve the integration and reduce the circuit power consumption. The plurality of magnetic tunnel junctions may be arranged in parallel or anti-parallel, and may also form different angles with the first direction A.

It should be noted that, in the above example, the devices have a strong process tolerance capability. For example, 'the angles φ1 and φ2 are the same angle' may be extended as that φ1 and φ2 are in a same interval (0°, 90°) or in a same interval (90°, 180°); 'the angles φ1 and φ2 are complementary to each other' may be extended as that one of φ1 and φ2 is in an interval (0°, 90°), while the other is in an interval (90°, 180°).

Figure 6:
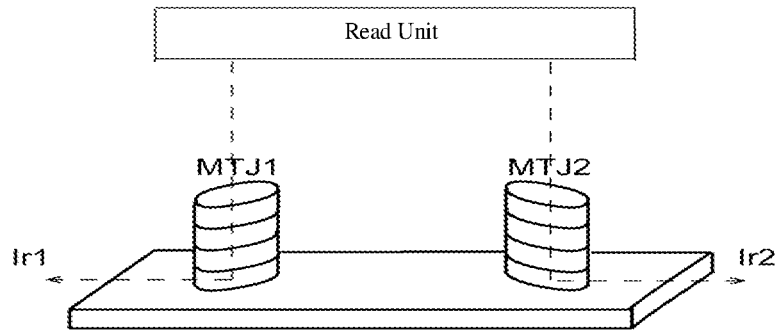
FIG. 6 illustrates a structural diagram of a magnetic random-access memory cell according to an embodiment of the present disclosure, including a read unit.

In a preferred embodiment, a top electrode may be disposed on a top of the magnetic tunnel junction, and an input electrode and an output electrode for the current are disposed on the opposite sides of the spin-orbit coupling layer 5 respectively to input the detection current (Ir1, Ir2) as illustrated in FIG. 6 and the spin-orbit torque current I as illustrated in FIG. 1. In which, preferably, a material of the electrode may be any one of tantalum Ta, aluminum Al, gold Au or copper Cu.

Preferably, a material of the free layer 4 and the fixed layer 2 may be ferromagnetic metal, and a material of the barrier layer 3 may be oxide. The magnetic tunnel junction has in-plane magnetic anisotropy, which means that the magnetization directions of the free layer 4 and the fixed layer 2 forming the magnetic tunnel junction are along the in-plane direction. In which, the ferromagnetic metal may be a mixed metal material formed by at least one of cobalt-iron CoFe, cobalt-iron-boron CoFeB, nickel-iron NiFe, etc., and proportions of the mixed metal materials may be the same or different. The oxide may be one of oxides such as magnesium oxide MgO or aluminum oxide $Al_2O_3$ to produce a tunneling magnetoresistance effect. In practical applications, other feasible materials may be used for the ferromagnetic metal and the oxide, which are not limited by the present disclosure.

The free layer 4 of the magnetic tunnel junction is fixed in contact with the spin-orbit coupling layer 5. The layers of the magnetic tunnel junction and the spin-orbit coupling layer 5 may be sequentially plated on a substrate from bottom to top by a traditional method such as ion beam epitaxy, atomic layer deposition or magnetron sputtering, and then two or more magnetic tunnel junctions may be prepared and formed by a traditional nano-device processing process such as photolithography or etching.

In a preferred embodiment, the spin-orbit coupling layer 5 may be made of a heavy metal film, an antiferromagnetic film, or a topological insulator film, etc., which may be shaped as rectangular, and a top area thereof is preferably larger than a bottom area of an outline formed by all of the magnetic tunnel junctions, so that two or more magnetic tunnel junctions can be disposed, and a bottom surface shape of the magnetic tunnel junction is completely embedded in a top surface shape of the heavy metal thin film, the antiferromagnetic thin film or the topological insulator thin film. Preferably, the material of the spin-orbit coupling layer 5 may be selected from one of platinum Pt, Tantalum Ta, tungsten W, platinum manganese PtMn, iridium manganese IrMn, bismuth selenium compound BiSe, antimony tellurium compound SbTe, bismuth tellurium compound BiTe, etc. In practical applications, the spin-orbit coupling layer 5 may also be formed of any other feasible material, which is not limited by the present disclosure.

In this embodiment, the first magnetic tunnel junction MTJ1 and/or the second magnetic tunnel junction MTJ2 comprises a fixed layer 2 at the top, a free layer 4 in contact with the spin-orbit coupling layer 5, and a barrier layer 3 disposed between the fixed layer 2 and the free layer 4. The magnetic tunnel junction has a three-layer structure and only comprises one free layer 4. In other embodiments, there may be provided a plurality of free layers 4, i.e., two or more free layers 4. Thus, the magnetic tunnel junction comprises a fixed layer 2 at the top, a plurality of free layers 4 and a barrier layer 3 disposed between every two adjacent layers, and a lowest free layer 4 is disposed in contact with the spin-orbit coupling layer 5. For instance, in a specific example, when two free layers 4 are comprised, the magnetic memory cell structure may comprise a spin-orbit coupling layer 5, and a second free layer 4, a barrier layer 3, a first free layer 4, a barrier layer 3, and a fixed layer 2 which are sequentially disposed on the spin-orbit coupling layer 5.

In a preferred embodiment, the magnetic random-access memory cell further comprises a write module, which is configured to input the spin-orbit torque current I to the spin-orbit coupling layer 5, so that the magnetic torque directions of the free layers 4 of the first magnetic tunnel junction MTJ1 and the second magnetic tunnel junction MTJ2 change to the direction of the elliptical long axis, and then the resistance states of the first magnetic tunnel junction MTJ1 and the second magnetic tunnel junction MTJ2 are opposite to each other.

It can be understood that in the present disclosure, by setting the direction of the elliptical long axis of the free layer 4 and the magnetic torque direction of the fixed layer 2 in each of the elliptical first magnetic tunnel junction MTJ1 and second magnetic tunnel junction MTJ2, in addition to the input direction of the spin-orbit torque current I, the resistance states of the first magnetic tunnel junction MTJ1 and the second magnetic tunnel junction MTJ2 can be opposite to each other after the spin-orbit torque current I is input at a time, and different logic data can be stored in the first magnetic tunnel junction MTJ1 and the second magnetic tunnel junction MTJ2 respectively.

In a preferred embodiment, as illustrated in FIG. 6, the magnetic random-access memory cell further comprises a read unit, which is configured to input the detection currents (Ir1, Ir2) to the first magnetic tunnel junction MTJ1 and the second magnetic tunnel junction MTJ2, and determine the resistance states of the first magnetic tunnel junction MTJ1 and the second magnetic tunnel junction MTJ2 according to the change of the detection current (Ir1, Ir2) input to the first magnetic tunnel junction MTJ1 and the second magnetic tunnel junction MTJ2.

It can be understood that since the resistance states of the first magnetic tunnel junction MTJ1 and the second magnetic tunnel junction MTJ2 are opposite to each other, the detection currents (Ir1, Ir2) may be input to the first magnetic tunnel junction MTJ1 and the second magnetic tunnel junction MTJ2 respectively through the read unit, and resistances of the first magnetic tunnel junction MTJ1 and the second magnetic tunnel junction MTJ2 may be determined according to the change of the detection current (Ir1, Ir2), thereby determining the data stored in the first magnetic tunnel junction MTJ1 and the second magnetic tunnel junction MTJ2.

It should be noted that the write module and the read unit may be implemented by a circuit structure, and the specific design of the circuit structure is conventional technical means in the art. Those skilled in the art can adopt different circuit structures to realize the functions of the write module and the read unit according to actual needs, which will not be described here.

The magnetic random-access memory cell of the present disclosure has the advantages of a low power consumption, a nonvolatile storage, a complete separation of read and write circuits to avoid read and write errors, an extremely fast write speed (sub-nanosecond level), a simple in-plane process without needing to consider any interface effect, a large current threshold, a high data storage reliability, etc.

Based on the same principle, this embodiment further discloses a magnetic random-access memory, comprising a plurality of the magnetic random-access memory cells according to this embodiment and arranged in an array.

The magnetic random-access memory, including permanent, non-permanent, removable and non-removable media, can store information by any method or technology. The information may be computer readable instructions, data structures, modules of programs, or other data. Examples of applications of the magnetic random-access memory include, but are not limited to, a Random-Access Memory (RAM), a Read-Only Memory (ROM), an Electrically Erasable Programmable Read-Only Memory (EEPROM), a flash memory or any other memory technology, a read-only Compact Disc Read-Only Memory (CD-ROM), a Digital Versatile Disc (DVD) or any other optical storage, a cassette magnetic tape, a magnetic tape disk storage or any other magnetic storage device or any other non-transmission medium, which can be configured to store information that can be accessed by a computing device.

Since the principle for the magnetic random-access memory to solve a problem is similar to that for the above magnetic random-access memory cell, the implementation of the magnetic random-access memory can refer to the implementation of the above magnetic random-access memory cell, which will not be described here.

Based on the same principle, this embodiment further discloses a computer device, comprising a memory, a processor and a computer program stored on the memory and operable on the processor.

The processor and/or the memory comprises the magnetic random-access memory cell according to this embodiment.

The magnetic random-access memory cell set forth in the above embodiments may be specifically disposed in a product device with a certain function. A typical implementation device is a computer device. Specifically, the computer device may be, for example, a personal computer, a laptop computer, a cellular phone, a camera phone, a smart phone, a personal digital assistant, a media player, a navigation device, an email device, a game console, a tablet computer, a wearable device or combinations thereof.

In a typical example, the computer device specifically comprises a memory, a processor and a computer program stored on the memory and operable on the processor. The processor and/or the memory comprises a magnetic random-access memory cell according to this embodiment.

Figure 7:
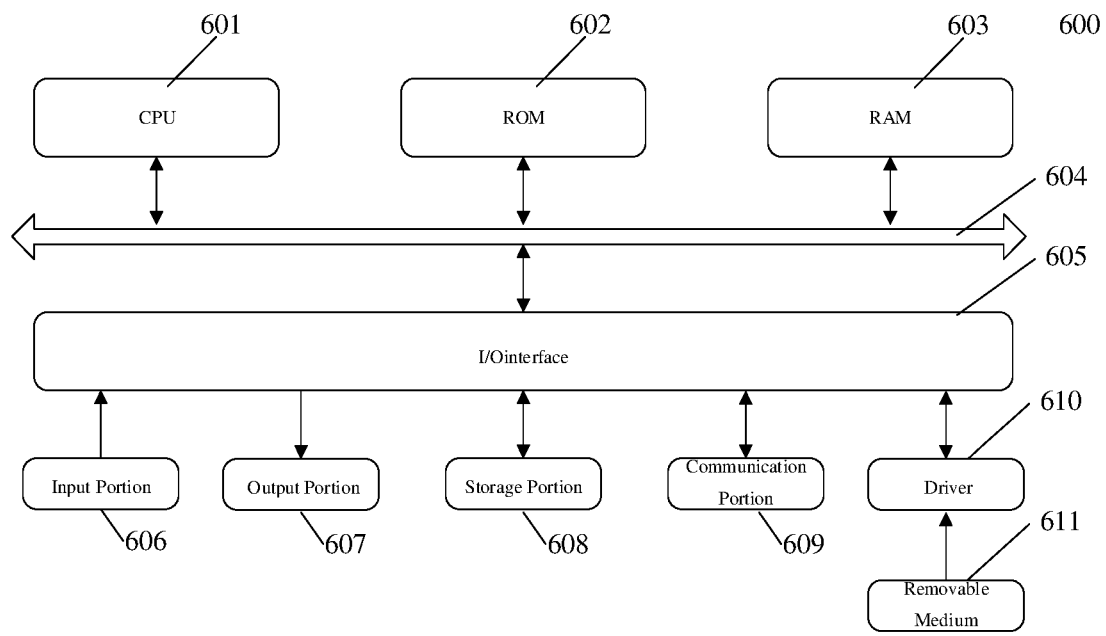
FIG. 7 illustrates a structural diagram of a computer device suitable for implementing an embodiment of the present disclosure.

Referring now to FIG. 7, which illustrates a structural diagram of a computer device 600 suitable for implementing an embodiment of the present disclosure.

As illustrated in FIG. 7, a computer device 600 comprises a central processing unit (CPU) 601, which can perform various appropriate works and processing according to a program stored in a Read-Only Memory (ROM) 602 or a program loaded from a storage portion 608 into a Random-Access Memory (RAM) 603. The RAM 603 further stores various programs and data required for operations of the system 600. The CPU 601, the ROM 602, and the RAM 603 are connected to each other through a bus 604. An input/output (I/O) interface 605 is also connected to the bus 604.

The following components are connected to the I/O interface 605: an input portion 606 comprising a keyboard, a mouse, etc.; an output portion 607 comprising a Cathode Ray Tube (CRT), a Liquid Crystal Display (LCD), a speaker, etc.; a storage portion 608 comprising a hard disk, etc.; and a communication portion 609 comprising a network interface card such as a LAN card, a modem, etc. The communication portion 609 performs communication processing via a network such as the Internet. A drive 610 is also connected to the I/O interface 605 as needed. A removable medium 611, such as a magnetic disk, an optical disk, a magneto-optical disk, a semiconductor memory, etc., is installed on the drive 610 as needed, so that a computer program read therefrom can be installed into the storage portion 608 as needed.

The present disclosure is described with reference to a flowchart and/or a block diagram of the method, device (system) and computer program product according to the embodiments of the present disclosure. It should be appreciated that each flow and/or block in the flowchart and/or the block diagram and a combination of flows and/or blocks in the flowchart and/or the block diagram can be implemented by computer program instructions. Those computer program instructions may be provided to a general computer, a dedicated computer, an embedded processor or a processor of other programmable data processing device to form a machine, so that the instructions, which are executed by the processor of the computer or other programmable data processing device, produce means for realizing the functions specified in one or more flows in the flowchart and/or one or more blocks in the block diagram.

These computer program instructions may also be stored in a computer readable memory capable of guiding the computer or other programmable data processing devices to work in a particular manner, so that the instructions stored in the computer readable memory can produce a product including instructing means for realizing the function(s) specified in one or more flows in the flowchart and/or one or more blocks in the block diagram.

These computer program instructions may also be loaded onto the computer or other programmable data processing devices, so that a series of operation steps can be performed in the computer or other programmable device to produce a processing realized by the computer, thus the instructions executed in the computer or other programmable devices provide the step(s) for realizing the function(s) specified in one or more flows in the flowchart and/or one or more blocks in the block diagram.

Further to be noted, the term 'comprise', 'include' or any other variant is intended to cover the non-exclusive inclusions, so that a process, a method, a commodity or a device comprising a series of elements comprise not only those elements, but also other elements not explicitly listed, or further comprise inherent elements of such process, method, commodity or device. In a case where there is no further limitation, the elements defined by a sentence 'comprising a . . . ' do not exclude other identical elements existing in the process, method, commodity or device comprising the elements.

Those skilled in the art should appreciate that the embodiments of the present disclosure may be provided as a method, a system, or a computer program product. Thus, the present disclosure may adopt the form of a complete hardware embodiment, a complete software embodiment, or a software and hardware combined embodiment. In addition, the present disclosure may adopt the form of a computer program product which is implementable in one or more computer readable storage mediums (including, but not limited to, a magnetic disk memory, a CD-ROM, an optical memory, etc.) containing computer readable program codes therein.

The present disclosure may be described in the general context of computer executable instructions executed by the computer, e.g., the program module. In general, the program module includes routine, program, object, component, data structure, etc. executing a particular task or realizing a particular abstract data type. The present disclosure may also be put into practice in distributed computing environments where tasks are executed by remote processing devices connected through a communication network. In the distributed computing environments, the program modules may be located in local and remote computer storage media including the storage device.

The embodiments herein are described in a progressive manner, and the same or similar parts of the embodiments can refer to each other. Each embodiment lays an emphasis on its distinctions from other embodiments. In particular, the system embodiment is simply described since it is substantially similar to the method embodiment, and please refer to the descriptions of the method embodiment for the relevant part.

Those described above are just specific embodiments of the present disclosure, and are not intended to limit the present disclosure. For those skilled in the art, various modifications and variations can be made to the present disclosure. Any modification, equivalent replacement, improvement, etc. made within the spirit and principle of the present disclosure should fall within the scope of the claims of the present disclosure.

What is claimed is:

1. A magnetic random-access memory cell, comprising: a spin-orbit coupling layer and a first magnetic tunnel junction and a second magnetic tunnel junction disposed on the spin-orbit coupling layer, the first magnetic tunnel junction and the second magnetic tunnel junction having at least two symmetrical axes with different lengths;

wherein an angle between an easy magnetization symmetrical axis direction of a free layer of the first magnetic tunnel junction and a length direction of the spin-orbit coupling layer is a preset first angle, and an angle between an easy magnetization symmetrical axis direction of a free layer of the second magnetic tunnel junction and the length direction of the spin-orbit coupling layer is a preset second angle; neither of the first angle and the second angle is zero degree, 90 degrees or 180 degrees;

when spin-orbit torque current is input to the spin-orbit coupling layer, a magnetic torque direction of the free layer of each of the first magnetic tunnel junction and the second magnetic tunnel junction changes to the easy magnetization symmetrical axis direction, so that resistance states of the first magnetic tunnel junction and the second magnetic tunnel junction are opposite to each other.

2. The magnetic random-access memory cell according to claim 1, wherein the first magnetic tunnel junction and the second magnetic tunnel junction are shaped as elliptical, the easy magnetization symmetrical axis is a long axis of an elliptical magnetic tunnel junction, an angle between a long axis direction of the free layer of the first magnetic tunnel junction and the length direction of the spin-orbit coupling layer is a preset first angle, and an angle between a long axis direction of the free layer of the second magnetic tunnel junction and the length direction of the spin-orbit coupling layer is a preset second angle.

3. The magnetic random-access memory cell according to claim 1, wherein the spin-orbit coupling layer comprises a length direction and a width direction; the length direction comprises two input directions of the spin-orbit torque current, i.e., a first direction and a second direction which are opposite to each other, and the width direction comprises two input directions of the spin-orbit torque current, i.e., a third direction and a fourth direction which are opposite to each other.

4. The magnetic random-access memory cell according to claim 3, wherein an angle between the first direction and the easy magnetization symmetrical axis direction of the free layer of the first magnetic tunnel junction is a preset first angle, an angle between the first direction and the easy magnetization symmetrical axis direction of the free layer of the second magnetic tunnel junction is a preset second angle which is complementary to the first angle, and an angle formed by the magnetic torque direction of the fixed layer of the first magnetic tunnel junction and the first direction is equal to an angle formed by the magnetic torque direction of the fixed layer of the second magnetic tunnel junction and the first direction;

when spin-orbit torque current is input to the spin-orbit coupling layer along the first direction or the second direction, the resistance states of the first magnetic tunnel junction and the second magnetic tunnel junction are opposite to each other.

5. The magnetic random-access memory cell according to claim 3, wherein an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is equal to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the first direction or the second direction, the resistance states of the first magnetic tunnel junction and the second magnetic tunnel junction are opposite to each other.

6. The magnetic random-access memory cell according to claim 3, wherein an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is complementary to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the third direction or the fourth direction, the resistance states of the first magnetic tunnel junction and the second magnetic tunnel junction are opposite to each other.

7. The magnetic random-access memory cell according to claim 3, wherein an angle between the first direction and the easy magnetization symmetrical axis direction of the free layer of the first magnetic tunnel junction is a preset first angle, an angle between the easy magnetization symmetrical axis direction of the free layer of the second magnetic tunnel junction and the first direction is a preset second angle which is equal to the first angle, and an angle formed by the magnetic torque direction of the fixed layer of the first magnetic tunnel junction and the first direction is complementary to an angle formed by the magnetic torque direction of the fixed layer of the second magnetic tunnel junction and the first direction;

when the spin-orbit torque current is input to the spin-orbit coupling layer along the third direction or the fourth direction, the resistance states of the first magnetic tunnel junction and the second magnetic tunnel junction are opposite to each other.

8. The magnetic random-access memory cell according to claim 1, further comprising a write module configured to input the spin-orbit torque current to the spin-orbit coupling layer, so as to change the magnetic torque direction of the free layer of each of the first magnetic tunnel junction and the second magnetic tunnel junction to the easy magnetization symmetrical axis direction, so that the resistance states of the first magnetic tunnel junction and the second magnetic tunnel junction are opposite to each other.

9. The magnetic random-access memory cell according to claim 8, further comprising a read unit configured to input detection current to the first magnetic tunnel junction and the second magnetic tunnel junction, and determine the resistance states of the first magnetic tunnel junction and the second magnetic tunnel junction according to a change of the detection current input thereto.

10. A magnetic random-access memory, comprising a plurality of the magnetic random-access memory cells according to claim 1 and arranged in an array.

11. A computer device, comprising a memory, a processor, and a computer program stored on the memory and operable on the processor, wherein the processor and/or the memory comprises the magnetic random-access memory unit according to claim 1.

* * * * *